(12) United States Patent
Yamada et al.

(10) Patent No.: US 6,664,563 B2
(45) Date of Patent: Dec. 16, 2003

(54) ELECTROLUMINESCENCE DEVICE WITH SHOCK BUFFER FUNCTION AND SEALING MEMBER WITH SHOCK BUFFER FUNCTION FOR THE SAME

(75) Inventors: Tsutomu Yamada, Motosu-gun (JP); Ryuji Nishikawa, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/106,660

(22) Filed: Mar. 26, 2002

(65) Prior Publication Data

US 2002/0149035 A1 Oct. 17, 2002

(30) Foreign Application Priority Data

Mar. 30, 2001 (JP) ........................................ 2001-098904

(51) Int. Cl.$^7$ ................................................ H01L 51/00
(52) U.S. Cl. ............................ 257/40; 257/40; 257/82; 257/88
(58) Field of Search .......................... 257/40, 82, 88, 257/758; 313/501, 461; 358/240; 345/60

(56) References Cited

U.S. PATENT DOCUMENTS

| | | | | |
|---|---|---|---|---|
| 4,320,418 A | * | 3/1982 | Pavliscak | .................... 358/240 |
| 5,198,685 A | * | 3/1993 | Kitani et al. | ................... 257/82 |
| 5,583,350 A | * | 12/1996 | Norman et al. | ................ 257/88 |
| 5,828,356 A | * | 10/1998 | Stoller | .......................... 345/60 |
| 5,869,929 A | * | 2/1999 | Eida et al. | ................... 313/501 |
| 6,054,724 A | * | 4/2000 | Ogihara et al. | ................ 257/88 |
| 6,218,774 B1 | * | 4/2001 | Pope | .......................... 313/461 |
| 6,495,917 B1 | * | 12/2002 | Ellis-Monagan et al. | ... 257/758 |
| 2002/0024051 A1 | * | 2/2002 | Yamazaki et al. | ............. 257/79 |
| 2002/0057565 A1 | * | 5/2002 | Seo | .............................. 362/84 |
| 2002/0075442 A1 | * | 6/2002 | Yanagawa et al. | .......... 349/155 |
| 2002/0113241 A1 | * | 8/2002 | Kubota et al. | ................. 257/79 |

FOREIGN PATENT DOCUMENTS

| | | | |
|---|---|---|---|
| JP | 5-94878 | 4/1993 | |
| JP | 7-211454 | * 8/1995 | ........... H05B/33/02 |

OTHER PUBLICATIONS

US patent application Publication US 2002/0075442 A1 By Seo (US class 362/84).*
US patent application Publication 2002/0075442 A1 by Yanagawa et al.(US class 349/155).*
US patent application Publication 2002/0113241 by Kubota et al.(US class 257/79).*
US patent application Publication US 2002/0024051 by Yamaguchi et l. (US class 257/79).*

* cited by examiner

*Primary Examiner*—David Nelms
*Assistant Examiner*—Thinh T. Nguyen
(74) *Attorney, Agent, or Firm*—Cantor Colburn LLP

(57) ABSTRACT

An electroluminescence (EL) device is resistant to external shock and has a prolonged service life. In the device, an emissive element substrate has a first electrodes formed on a substrate, an emissive element layer formed over the first electrodes, and a second electrode formed on the emissive layer. A sealing member covers the second electrode of the emissive element substrate. Shock buffers in pillar, spherical, or sheet form are arranged in a gap between the second electrode and the sealing member. When the shock members are made of a hard material, they are preferably arranged above the non-emissive areas in the EL device.

31 Claims, 7 Drawing Sheets

ELECTROLUMINESCENCE DEVICE WITH SHOCK BUFFER FUNCTION AND SEALING MEMBER WITH SHOCK BUFFER FUNCTION FOR THE SAME

BACKGROUND OF THE INVENTION

1. Field of the Invention

The present invention relates to an electroluminescence (EL) device and, particularly, to a sealing structure for an EL device.

2. Description of Related Art

Generally, the term electroluminescence element (EL element) is used to refer to a single element, while the term electroluminescence device (EL device) refers to a device including one or more EL elements arranged on a substrate. In EL elements, the substances used for the emissive layer are commonly classified into inorganic compounds and organic compounds. The former substance is used in inorganic EL elements, while the latter substance is used for producing organic EL elements.

FIG. 1 shows the configuration of a conventional EL device. In the EL device 200 shown in FIG. 1, plurality of first electrodes 12 are formed in the emissive area of a substrate 10 formed from, for example, a glass substrate. An emissive element layer 16 composed of an inorganic or organic compound is formed over the first electrodes 12. A single second electrode 14 is formed on the emissive element layer 16. Thus, an emissive element substrate 18 is formed of the substrate 10, the first electrodes 12, the emissive element layer 16, and the second electrode 14.

The first electrode 12 is an electrode (anode) made of a transparent conductive material, e.g. ITO (Indium Tin Oxide). The second electrode is a metal electrode (cathode).

The sealing member 42 covers the open region above the second electrode 14 of the emissive element substrate 18 so as to form a gap 30 between the second electrode 14 and the sealing member 42. The ends of the sealing member 42 are adhered to the emissive element substrate 18 using a resin material. In order to prevent deterioration of an emissive element which can be caused by absorption of moisture, an inert gas, such as nitrogen, or silicone oil is introduced into the gap 30 under a reduced pressure.

In the emissive element layer 16 of the EL device 200, holes are injected from the first electrode 12 while electrons are injected from the second electrode 14. The holes and electrons thus injected move through the emissive element layer 16, collide with each other, and recombine. When holes and electrons recombine, they disappear, but the energy generated by their recombination excites luminous molecules, thus causing light emission.

In the conventional EL element or EL device 200 shown in FIG. 1, because the gap 30 is provided between the second electrode 14 and the sealing member 42, an externally applied mechanical vibration or shock may deform the sealing member 42 in the direction of the second electrode 14. As a result, the sealing member 42 may collide with the second electrode 14, thus damaging the second electrode 14 or the emissive element forming layer 16.

Before the EL device is shipped, it is adjusted under a pressure of, for example, 5 Pa. When this is done, the sealing member 42 may deform and damage the organic EL element. Such damage to the organic EL element may cause dark spots and hasten the deterioration of the EL organic element, thus resulting in decreased display quality or in a reduced operable life of the device.

SUMMARY OF THE INVENTION

The present invention was made to overcome the above-mentioned problems. It is an object of the present invention to provide an electroluminescence device capable of maintaining stable light emissive characteristics over a prolonged service life.

In order to accomplish the object, an electroluminescence device with shock buffer function and a sealing member with shock buffer function for an electroluminescence device have the following features.

An electroluminescence device with shock buffer function comprises an emissive element substrate having a first electrode formed on a substrate and a second electrode formed above the first luminous electrode and an intervening emissive layer; a sealing member for sealing an element forming surface of the emissive element substrate; and shock buffers arranged in a gap between said emissive element substrate and said sealing member.

The shock buffers, each of which is disposed in the gap between the emissive element substrate and the sealing member, can absorb or dampen externally applied vibration and shock which otherwise would be transmitted to the sealing member. Thus, this approach suppresses the damage of the emissive element substrate and enables production of a stable EL device having a long serviceable life.

In the electroluminescence device with shock buffer function, the shock buffers may protrude from or may be securely fixed in the surface of the sealing member which faces the emissive element substrate.

A flexible shock buffer may be disposed over the entire upper surface of an emissive element substrate. However, a shock buffer formed of a hard material may be preferably disposed on non-emissive areas other than emissive areas of the emissive element substrate. The hard shock buffer can distribute the externally-applied force but it cannot completely absorb the shock. Hence, it is preferable that the shock buffer not be disposed on the luminous area. Particularly, the hard shock buffer is previously fixed on the opposite surface of the element forming substrate, which confronts the sealing member, or that it protrudes toward the side of the opposite surface, so that the hard shock buffer is disposed over areas other than luminous areas.

In a sealing member which covers an element forming surface of an emissive element substrate, the emissive element substrate having a first electrode formed on a substrate and a second electrode formed above both the first electrode and an intervening emissive layer; the sealing member may comprise shock buffers protruding from or securely fixed in the surface of the sealing member facing the emissive element substrate.

For example, the sealing member may cover the emissive element substrate which has shock buffers fixed on the back surface thereof. This structure can provide a stable EL device that has anti-vibration or shock-absorbing characteristics and, therefore, a longer operating life. A glass substrate may be used for the sealing member. Pillar-like shock buffers, each of which is made of a resist material, may be mounted on the sealing member in a manner such that they protrude toward the element forming substrate.

BRIEF DESCRIPTION OF THE DRAWINGS

These and other objects, features, and advantages of the present invention will become more apparent from the following detailed description taken in conjunction with the attached drawings, in which.

DESCRIPTION OF THE EMBODIMENTS

Preferred embodiments according to the present invention will be described below while referring to the attached drawings. In the following, constituent elements identical to those in the conventional EL element or EL device described above are labeled with the same reference numbers and their description is not repeated.

First Embodiment

Figure 2:
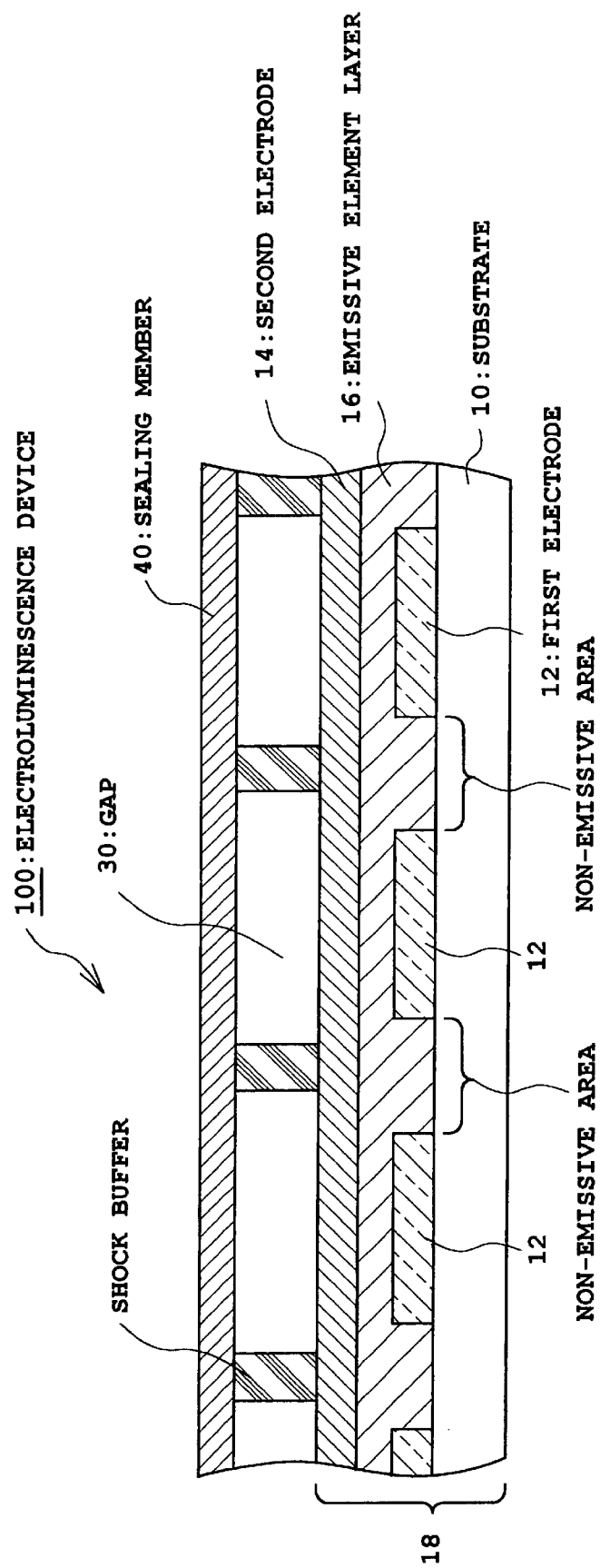
FIG. 2 is a cross-sectional view illustrating the configuration of an electroluminescence device according to a first embodiment of the present invention.

FIG. 2 shows the configuration of an EL device 100 according to a first embodiment of the present invention. An emissive element substrate 18 is formed of a substrate 10, a plurality of first electrodes 12, an emissive element layer 16, and a second electrode 14. The substrate 10 is formed from a glass substrate. Each of the first electrodes 12 is an ITO electrode (anode) made of a transparent conductive material formed on the substrate 10. The emissive element layer 16 is made of an inorganic or organic compound overlying the first electrodes 12. The second electrode 14 is formed of a single metal electrode (cathode), for instance, aluminum, overlying the emissive element layer 16. In the EL device, the emissive area is the emissive element layer 16 sandwiched between the first electrodes 12 and the second electrode 14. Referring to FIG. 2, areas where first electrodes 12 are not formed become non-emissive areas.

The lead electrodes (not shown) extending out from the first electrodes 12 and the lead terminal (not shown) extending out from the second electrode 14 are connected to an outer power source. The current flowing from a first electrode 12 to the second electrode 14 excites luminous molecules, thus emissive light.

Moreover, in the EL device 100, a sealing member 40, made of steel, e.g. SUS, or glass, covers the second electrode 14 of the emissive element substrate 18. At least one shock buffer 20 is disposed in the gap 30 between the second electrode 14 and the sealing member 40. The shock buffer 20, acting as a spacer, absorbs externally applied vibration or shock imparted on the sealing member 40. This structure can greatly reduce the possibility that the second electrode 14 will be damaged due to deformation of the sealing member 40.

Because the gap 30 between the second electrode 14 and the sealing member 40 is normally 20 $\mu$m or less, the height of each pillar-like shock buffer 20 inserted between the second electrode 14 and the sealing member 40 is also 20 $\mu$m or less, and, more preferably, 2 to 10 $\mu$m.

A shock buffer 20, made of a flexible material, may be disposed on any place of the surface of the emissive element substrate 18. A shock buffer 20, made of a hard material, is preferably disposed on areas other than emissive areas of the emissive element substrate 18.

The shock buffer 20 is preferably formed of an insulating material, preferably, of a rubber with superior shock-absorbing properties. Moreover, the shock buffer 20 is preferably formed of a porous material through which readily permeates inert gases of the type introduced into an EL device 100. "MICRO-TEX" (trademark) manufactured by Nitto Denko Co. and "ePTFE" (brand name) manufactured by Japan Gore-Tex are examples of such preferable porous materials. Both of these materials are made of polytetrafluoroethylene (PTFE), which blocks invasion of moisture or dirt but allows gas such as air to permeate.

The shock buffer 20 may have the drying function of a desiccant, e.g. calcium carbonate, together with the shock buffer function. Although exposure to moisture causes an EL device to deteriorate, by providing the shock buffer 20 with a drying function, it is not necessary to provide an additional desiccant in the EL device 100. This approach can simplify the EL device manufacturing process and can prolong the service life of the EL device.

Figure 1:
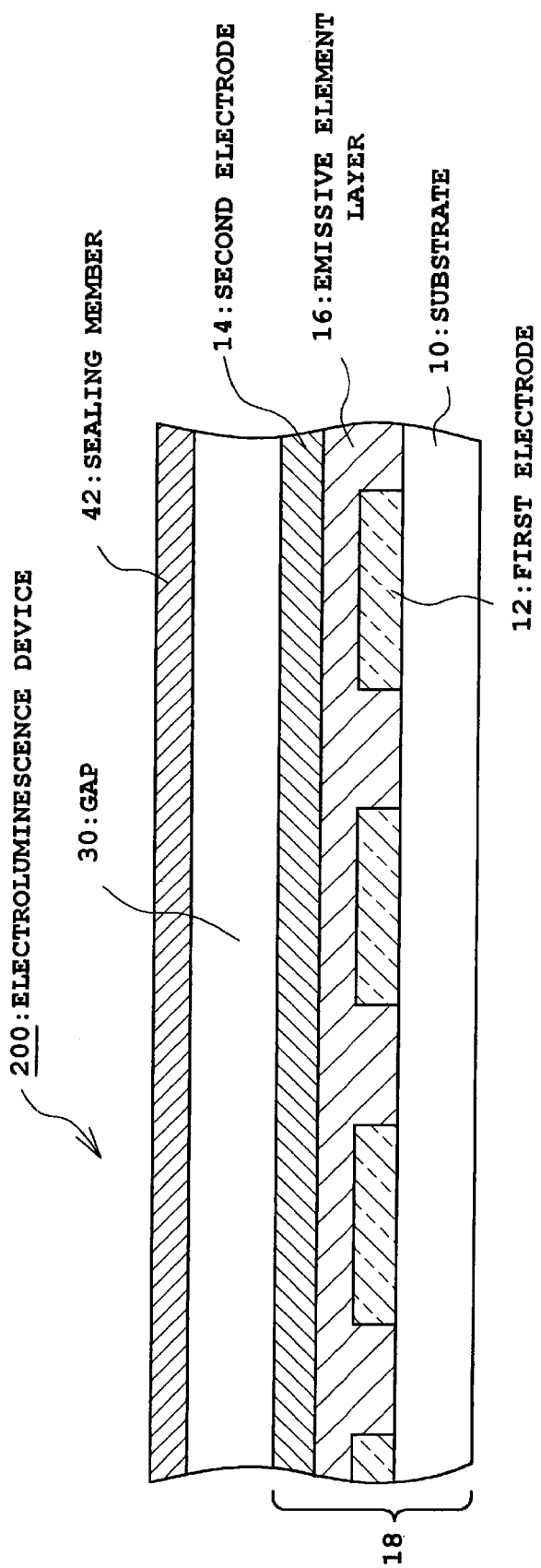
FIG. 1 is a cross-sectional illustrating the configuration of a conventional electroluminescence device.

The shock buffers 20, which may be fixed at both ends using a double-sided tape, may be aligned with and fixed to the second electrode 14 and the sealing member 40. With such a structure, the shock buffers 20 may be aligned using alignment marks in such a way that they are fixed on areas other than emissive areas. Moreover, as will be described later, holes are formed by etching predetermined positions of the back surface of the sealing member 40. One end of each shock buffer is securely fixed in a hole (opening) using an adhesive agent such as a double-sided tape, or the shock buffers are directly bonded in the holes under pressure. In this manner, the shock buffers are disposed in the gap 30 in a way such that other ends thereof are in contact with the second electrode 14 or become in contact with the second electrode 14 upon mechanical impact. Alternately, the shock buffers 20 may be formed by first forming the resist layer over the sealing member 40, for example, a glass substrate, and then etching off regions corresponding to luminous area in an EL device 100, as shown in FIG. 1.

In full-color EL devices, the red (R), green (G), and blue (B) emissive elements may be separated from the second electrode 14 by different distances. In such a structure, the shock buffer 20 may be preferably adjusted for height, aligned, and disposed in such a way that the sealing member 40 is not deflected.

Figure 3:
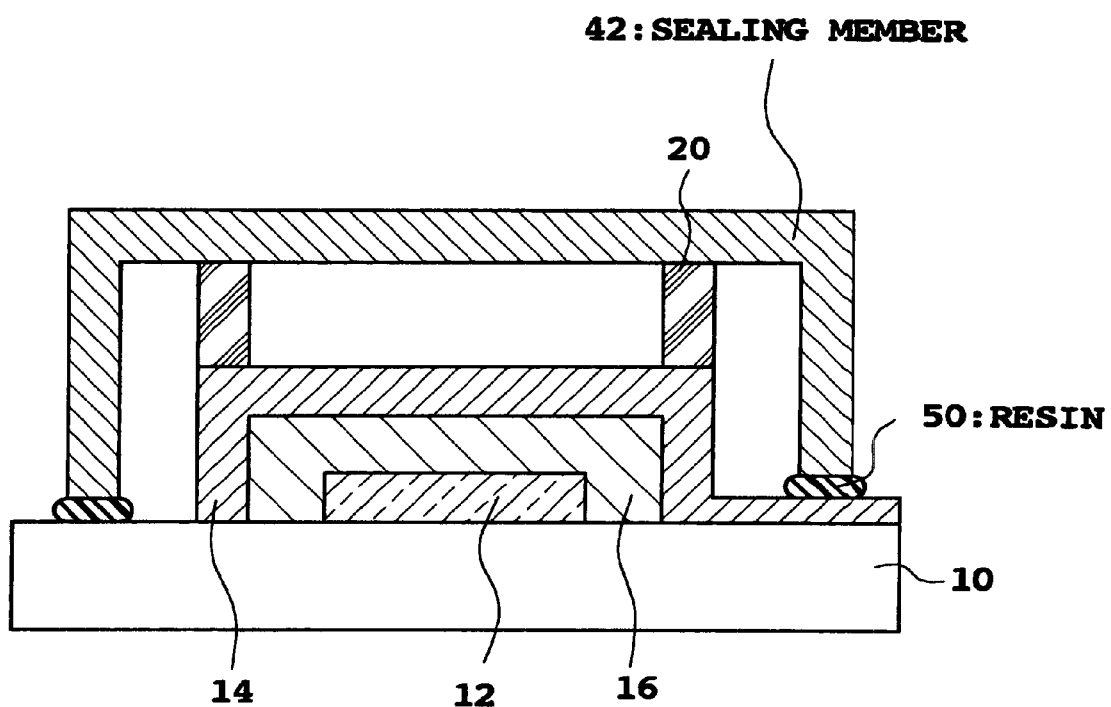
FIG. 3 is a cross-sectional view illustrating the configuration of an electroluminescence element according to the first embodiment of the present invention.

FIG. 3 shows the configuration of another EL element according to the present embodiment. Constituent elements identical to those in the above-described EL device will be labeled with the same reference numerals and their description will not be repeated here.

The EL device shown in FIG. 3 has a single emissive area. As in the above-described EL device, each pillar-like shock buffer 20 is disposed in an area other than the emissive area.

Even if vibrations or shocks are externally applied to the sealing member 42 acting as a sealing envelope, the shock buffers 20 buffer against them. This structure can prevent the element from being damaged when the sealing member 42 deforms so as to strike the second electrode.

Second Embodiment

Figure 4:
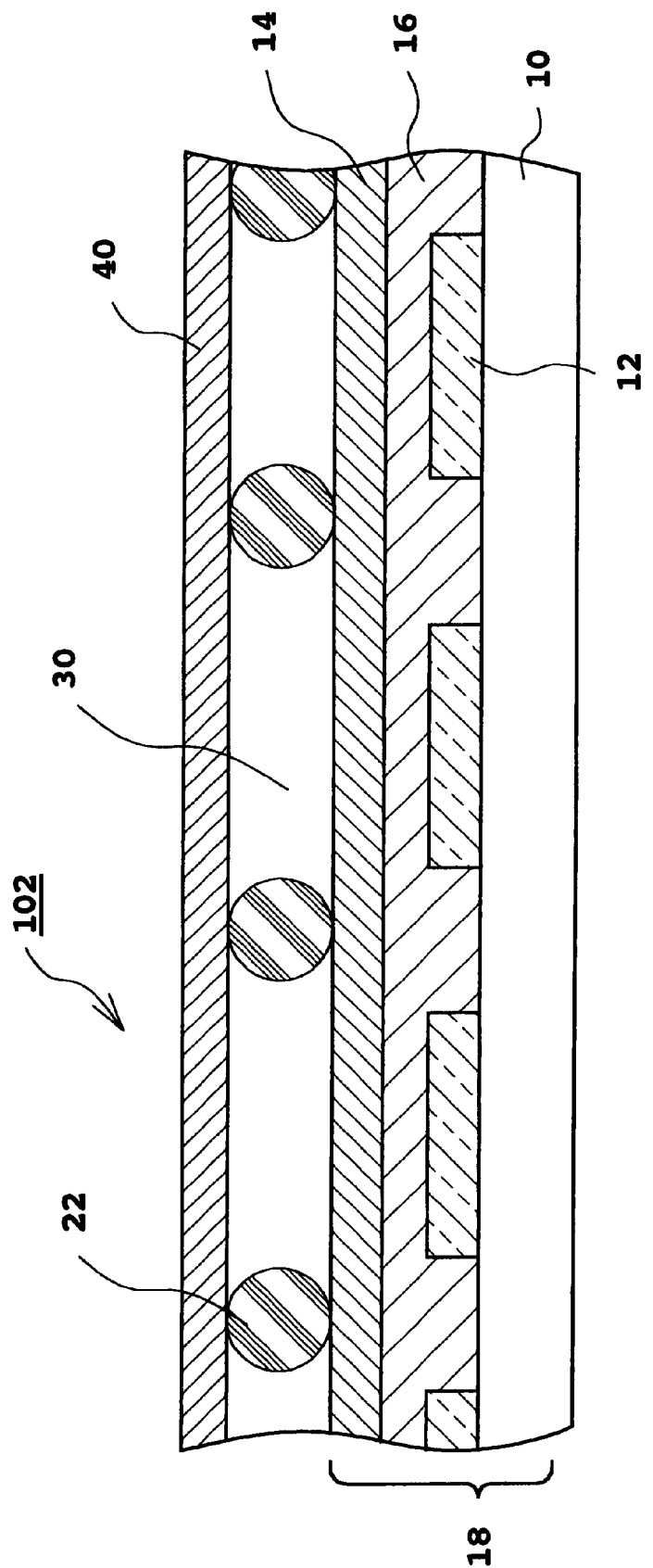
FIG. 4 is a cross-sectional view illustrating the configuration of an electroluminescence device according to a second embodiment of the present invention.

FIG. 4 is shows the configuration of an EL device 102 according to a second embodiment of the present invention. Constituent elements identical to those described above will be labeled with the same reference numerals and their description will not be repeated here.

As described above, a pillar-like shock buffer 20 (FIG. 2) is used with the first embodiment. However, in the second embodiment, a spherical shock buffer 22 is employed. By minimizing the contact area with the sealing member 40 or the second electrode 14, the spherical shock buffer 22 maintains superior shock buffer capability.

Because the spacing of the gap 30 is less than 20 $\mu$m, the diameter of the shock buffer 22 would normally be less than 20 $\mu$m, more preferably, 2 $\mu$m to 10 $\mu$m. The shock buffer 22, which is made of a flexible material, may be disposed as desired on an area of the emissive element substrate 18. The shock buffer 22, which is made of a hard material, may be preferably disposed on an area other than the emissive area of the emissive element substrate 18. However, a large number of spherical shock buffers 22 distributed between the sealing member 40 and the second electrode 14 can disperse the externally-applied force. The shock buffers 22 can be disposed over the emissive areas without any resulting problems.

The material of the shock buffer 22 is similar to that of the shock buffer 20 in the first embodiment. The shock buffer 22 may contain a desiccant, e.g. calcium carbonate, to provide a drying function together with a shock absorption function.

Moreover, the shock buffer 22, both ends of which are adhered with a double-sided tape, may be aligned and fixed with the second electrode 14 and the sealing member 40.

Figure 5:
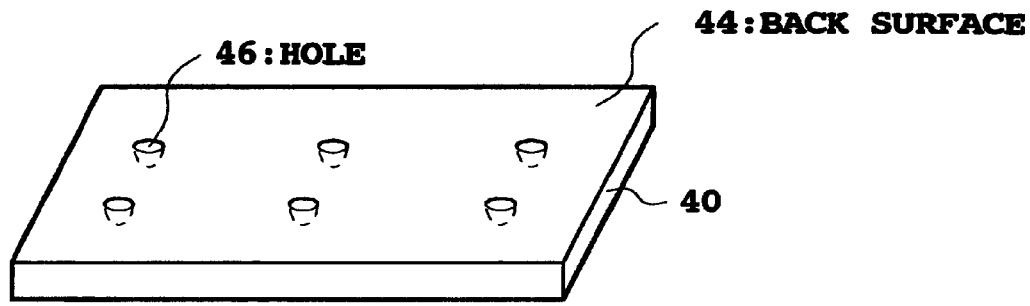
FIG. 5 is a diagram illustrating an electroluminescence device manufacturing method according to the second embodiment of the present invention, wherein holes are formed on the back surface of a sealing member.
Figure 6:
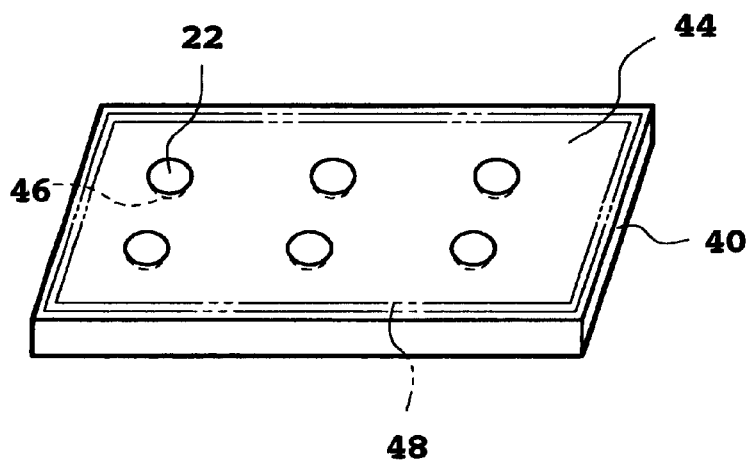
FIG. 6 is a diagram illustrating an electroluminescence device manufacturing method according to the second embodiment, wherein shock buffers are securely attached to holes formed in a shock-absorbing sealing member.
Figure 7:
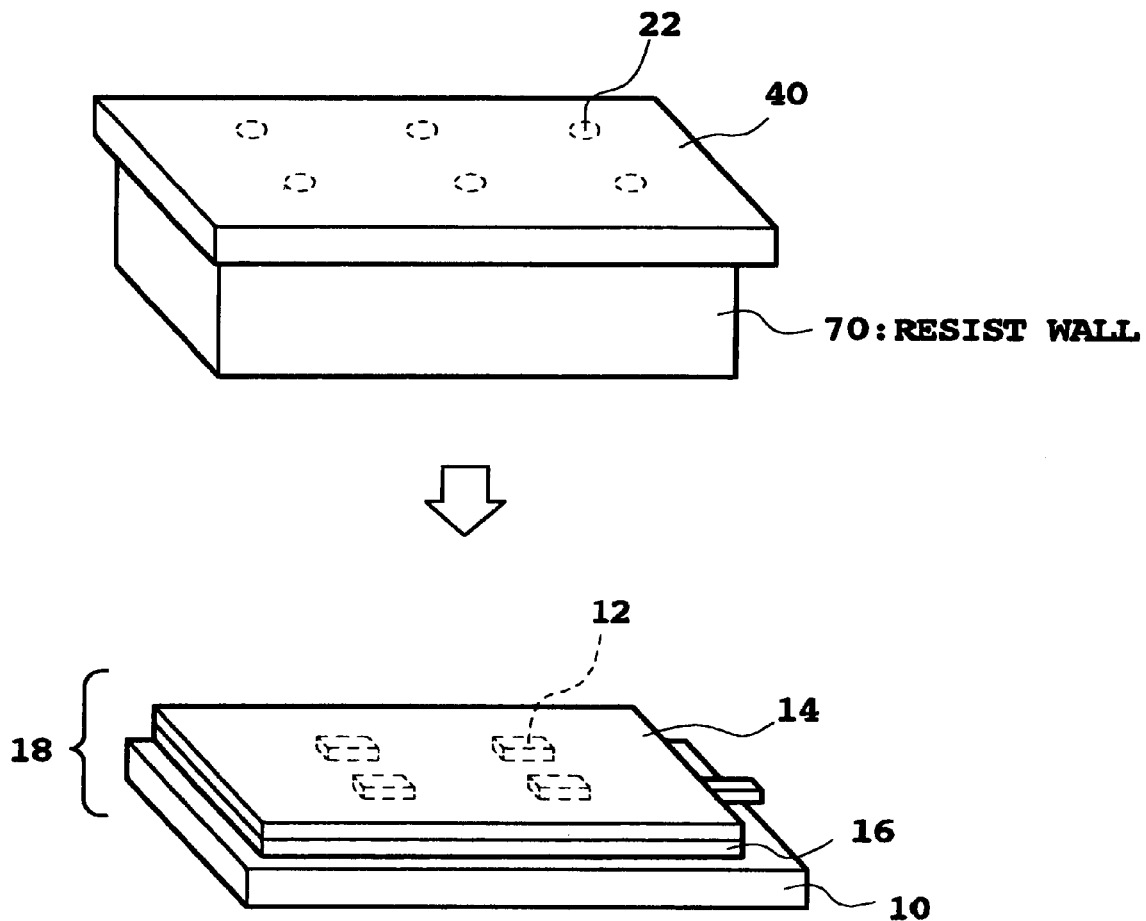
FIG. 7 is a diagram illustrating an electroluminescence device manufacturing method according to the second embodiment, wherein a shock-absorbing sealing member having a resist wall covers an emissive element substrate.

As shown in FIG. 5, by etching the sealing member 40, holes are formed at predetermined positions in the back surface 44 of the sealing member 40. As shown in FIG. 6, a portion of a shock buffer 22 is fixed in the hole 46 using an adhesive agent such as a double-sided tape or a shock absorber 22 is directly bonded under pressure. The shock buffer 22 is fixed to the sealing member 40. Thus, a sealing member with a shock buffer is completed. Next, as shown in FIG. 7, a resist wall 70 having a suitable height is formed along the peripheral fringes 48 of the back surface 44 (FIG. 6) of the sealing member. The structure thus formed covers the upper surface of the emissive element substrate 18. The peripheral fringes of the resist wall 70 are fixed to the emissive element substrate using an adhesive agent. With such a configuration, the other ends of the shock buffers 22 may be in continuous contact with the second electrode 14, or may configured so as to come in contact with the second electrode 14 in response to mechanical shock.

In the full-color EL device 102 according to the present embodiment, the red (R), green (G), and blue (B) emissive elements may have different height relative to the second electrode 14. Thus, it is preferable that the grain diameter of the shock buffer 22 be adjusted to enable positioning such that the sealing member 40 is inserted with no deformation.

The present embodiment has been explained using an example EL device. However, in an EL element, a spherical shock buffer may be inserted into the gap 30 to buffer the mechanical shock. The method of sealing an EL device by fixing the shock buffer shown in FIGS. 5-7 can be applied with the first embodiment and the third embodiment (to be described later) of the present invention.

Third Embodiment

Figure 8:
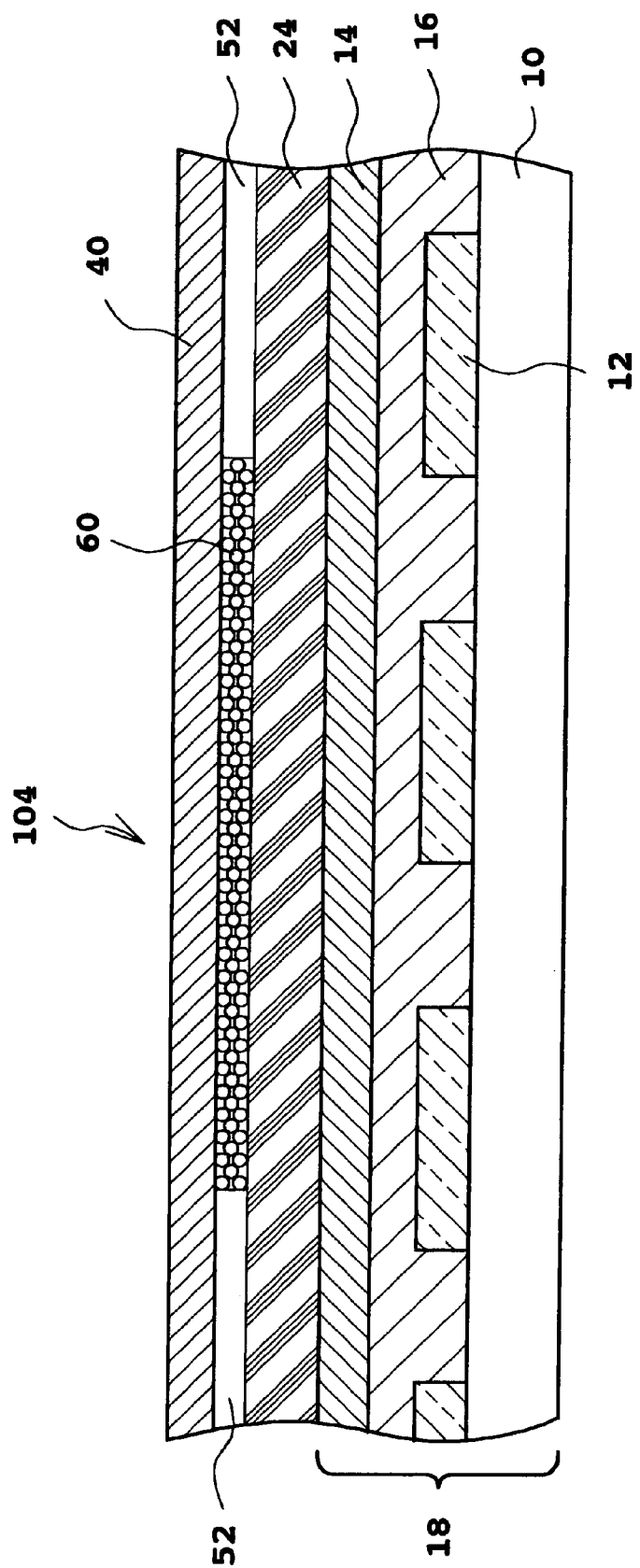
FIG. 8 is a cross-sectional view illustrating the configuration of an electroluminescence device according to a third embodiment of the present invention.

FIG. 8 shows the configuration of an EL device 104 according to a third embodiment of the present invention. As with the previous embodiments, constituent elements identical to those described earlier will be labeled with the same reference numerals and their description will not be repeated.

A pillar-like shock buffer 20 (FIG. 2) was employed in the first embodiment. However, the third embodiment uses at least one shock buffer 24. This structure can uniformly absorb an external shock applied to a portion of the EL device 104.

The thickness of the shock buffer 24 is 20 $\mu$m or less, preferably, 2 $\mu$m to 10 $\mu$m, because the spacing of the gap 30 usually is 20 $\mu$m or less. Because it is disposed over an emissive area, the shock buffer 24 is preferably made of a flexible material.

With the exception that it is formed from a flexible material, the shock buffer 24 according to the present embodiment is similar to the shock buffer 20 of the first embodiment. The shock buffer 24 may contain a desiccant, for example, calcium carbonate, to provide a drying function along with the shock buffer function. When the shock buffer has no desiccant capability, the double-sided tape 52 is adhered to the upper surface of shock buffer 24 in such a manner as to form a space for accepting the desiccant 60, as shown in FIG. 8. The desiccant 60 is installed within this space and the shock buffer 24 and the desiccant are then adhered to the back surface of the sealing member 40 with the double-sided tape. The second electrode 14 may be in continuous contact with the lower surface of the shock buffer 24 or may be arranged so as to contact the lower surface of the shock buffer 24 in reaction to a mechanical shock.

As in the previous embodiments, in the full-color EL device 104, the distances between the red (R), green (G), and blue (B) emissive elements may have different height relative to the second electrode 14. To accommodate this, a shock buffer 24 of varying thickness corresponding to each distance is preferably inserted in such a way that the sealing member 40 is not deformed.

The third embodiment has been explained using an example EL device. However, one or more shock buffers may also be preferably inserted in an EL element for shock absorption.

The above-described illustrative embodiments of the present invention are applicable to, for example, active matrix-type EL devices. An active matrix-type EL device may comprise of an EL element drive thin-film transistor and a switching thin-film transistor for each pixel. The EL element drive thin-film transistor has a source connected to the first electrode, a drain connected to an EL element drive power source, and a gate connected to the source of the switching thin-film transistor. The switching thin-film transistor has a drain connected to a data signal line and a gate connected to a gate signal line. The present invention when applied to such a device can provide effects similar to those of the above-described embodiments. Moreover, the EL device of the present invention can also be effectively applied to vacuum fluorescent display devices (VFD), LEDS, and other applications.

As described above, according to the present invention, the shock buffers, arranged in the gap between an emissive element substrate and a sealing member, can buffer external shock or vibration applied to the sealing member. As a result, the risk of the sealing member damaging the emissive element substrate is greatly reduced.

Moreover, the shock buffers, whether fixed to or protruding from the sealing member, can uniformly absorb external shock without deteriorating the function of an EL device or EL element.

Consequently, a stable EL device or EL element with a long operating life can be obtained.

It will be well understood that the above description is merely provided to illustrate the present invention. Various modifications and variations of the present invention may be made by a person skilled in the art without departing from the spirit or scope of the present invention. It is intended that the claims of the present invention cover all such modifications, variations, and changes of the present invention.

What is claimed is:

1. An electroluminescence device with a shock buffering function, comprising:

an emissive element substrate comprising a first electrode formed on a substrate and a second electrode formed above both said first electrode and an intervening emissive layer;

a sealing member for sealing an element forming surface of said emissive element substrate; and shock buffers arranged in a gap between said emissive element substrate and said sealing member.

2. The device according to claim 1, wherein said shock buffers protrude from or are securely fixed in the surface of said sealing member which faces said emissive element substrate.

3. The device according to claim 2, wherein each of said shock buffers has a pillar form and at least one of said shock buffers protrudes from or is securely fixed in a gap between said emissive element forming element and said sealing member.

4. The device according to claim 3, wherein said shock buffers are each made of a flexible material and in a form such that they can be arranged over all areas of said emissive element substrate.

5. The device according to claim 3, wherein said shock buffers are each made of a hard material and are arranged on areas of said emissive element substrate other than emissive areas.

6. The device according to claim 3, wherein each of said shock buffers is made of an insulating and resilient material.

7. The device according to claim 6, wherein each of said shock buffers is made of a porous material.

8. The device according to claim 6, wherein each of said shock buffers contains a desiccant.

9. The device according to claim 7, wherein each of said shock buffers contains a desiccant.

10. The device according to claim 2, wherein each of said shock buffers is spherical and at least one of said shock buffers protrudes from or is securely fixed in a gap between said emissive element substrate and said sealing member.

11. The device according to claim 10, wherein said shock buffers are each made of a flexible material and in a form such that they can be arranged over all areas of said emissive element substrate.

12. The device according to claim 10, wherein said shock buffers are each made of a hard material and are arranged on areas of said emissive element substrate other than emissive areas.

13. The device according to claim 10, wherein each of said shock buffers is made of an insulating and resilient material.

14. The device according to claim 13, wherein each of said shock buffers is made of a porous material.

15. The device according to claim 13, wherein each of said shock buffers contains a desiccant.

16. The device according to claim 14, wherein each of said shock buffers contains a desiccant.

17. The device according to claim 2, wherein each of said shock buffers is sheet-like and at least one of said shock buffers is arranged in a gap between said emissive element substrate and said sealing member.

18. The device according to claim 17, wherein each of said shock buffer is made of an insulating and resilient material.

19. The device according to claim 18, wherein each of said shock buffer is made of a porous material.

20. The device according to claim 18, wherein each of said shock buffers contains a desiccant.

21. The device according to claim 19, wherein each of said shock buffers contains a desiccant.

22. An electroluminescence device with shock buffer function, comprising:

an emissive element substrate having a first electrode formed on a substrate and a second electrode formed above both said first electrode and an intervening emissive layer;

a sealing member for sealing an element forming surface of said emissive element substrate;

a sheet-like shock buffer arranged in a gap between said emissive element substrate and said sealing member, and a desiccant disposed in a gap between said sealing member and the shock buffer.

23. The device according to claim 22, wherein said shock buffer is made of an insulating and resilient material.

24. The device according to claim 23, wherein said shock buffer is made of a porous material.

25. A sealing member, which covers an element forming surface of an emissive element substrate, said emissive element substrate having a first electrode formed on a substrate and a second electrode formed above both said first electrode and an intervening emissive layer; said sealing member comprising:

one or more shock buffers protruding from or securely fixed in the surface of said sealing member which faces said emissive element substrate.

26. The sealing member according to claim 25, wherein each of said shock buffers is spherical and at least one of said shock buffers protrudes from or is securely fixed in the surface of said sealing member facing said emissive element substrate.

27. The sealing member according to claim 26, wherein the surface of said sealing member facing said emissive element substrate has at least one hole, and a portion of at least one of said shock buffers is securely fixed in said hole.

28. The sealing member according to claim 26, wherein each of said shock buffers is made of an insulating and resilient material.

29. The sealing member according to claim 28, wherein each of said shock buffers is made of a porous material.

30. The sealing member according to claim 28, wherein each of said shock buffers contains a desiccant.

31. The sealing member according to claim 29, wherein each of said shock buffers contains a desiccant.

* * * * *